United States Patent [19]

Reif

[11] Patent Number: 5,345,200
[45] Date of Patent: Sep. 6, 1994

[54] COUPLING NETWORK

[75] Inventor: Robert H. Reif, Groton, Mass.

[73] Assignee: GTE Government Systems Corporation, Waltham, Mass.

[21] Appl. No.: 68,557

[22] Filed: Aug. 26, 1993

[51] Int. Cl.$^5$ ............................................... H03H 7/38
[52] U.S. Cl. ......................................... 333/32; 333/138; 333/167; 455/120
[58] Field of Search ................. 333/24 R, 32, 35, 138, 333/167; 455/120, 121

[56] References Cited

U.S. PATENT DOCUMENTS 3,544,922 12/1970 McConnell ........................ 333/32 X
4,885,541 12/1989 Hayes ................................ 333/32 X Primary Examiner—Paul Gensler
Attorney, Agent, or Firm—J. Stephen Yeo

[57] ABSTRACT

A coupling network for coupling a signal at a frequency from a voltage source to a load. The voltage source has a source resistance. The load has a load resistance and a load reactance. The ratio of the load reactance to the load resistance greater than 100. The coupling network includes a reactive element and a delay circuit. The reactive element is arranged in series with the load to resonate with the load reactance at the frequency. The delay circuit is between the reactive element and the source, has a delay equivalent to a quarter wave length transmission line at the frequency and has a characteristic impedance equal to the square root of the product of the values of the load resistance and the source required resistance.

4 Claims, 1 Drawing Sheet

COUPLING NETWORK

BACKGROUND OF THE INVENTION

This invention pertains to coupling networks, and more particularly, is concerned with networks for coupling transmitters to antennas.

The problem of coupling power into a load with a high ratio of reactance to resistance (high Q) has been present for many years and many solutions have been proposed. For a given load the bandwidth and degree of match are related, and that the wider the bandwidth, the poorer the match within that bandwidth. The use of multi-element ladder networks to provide a suitable match over the desired bandwidth rapidly becomes complex with an extreme degree of difficulty in adjusting such networks. The losses increase as the number of components due to the inherent loss in each component. In addition, where high power is present, the component costs can be quite high so any benefits are quickly offset by the cost of such a network. Frequency change can also be difficult and a time consuming process.

Other arrangements, such as fast switching circuits to tune a matching network to follow the instantaneous frequency of the source have had only limited success. The problem with this arrangement is the lack of a suitable switching element that is fast enough and can handle high power with adequate linearity and high reliability. The linearity problem can manifest itself in spurious signals generated in the switching circuitry and leading to interference. Other methods of providing adequate bandwidth are based on resistive loading. Some times lumped resistance with a deliberate loss in efficiency is added. Alternatively, inherent losses in coupling network components provide resistance. The low efficiency of vacuum tube transmitters contributed to a significant source resistance which has a broadening effect on the system frequency response. Solid state switching mode designs, however, have a much higher efficiency with a corresponding lower internal source resistance. This reduces the bandwidth broadening effect of the source. To maintain this high efficiency of the modern switching mode sources, a reactive network should be used. Adding series or shunt resistance to improve the bandwidth of the load is not a practical solution at the high power levels required for effective communications in the lower portions of the radio spectrum; i.e., LF and lower.

There exists a need to provide a coupling network for coupling a signal at a frequency from a voltage source to a load, where the voltage source has a source resistance, the load has a load resistance and a load reactance, and the ratio of the load reactance to the load resistance greater than 100.

An object of the invention is to provide a means to couple efficiently a source of AC energy to a reactive load with a natural bandwidth much less than the distribution of energy in the source, such as coupling of a solid state, high power, VLF (very low frequency) transmitter to a small (in terms of wavelength) antenna structure. The antenna has an electrical Q that is very high, greater than 100, and a resulting natural bandwidth that i s much less than the bandwidth of the modulated signal.

Another object of this invention is a simple but unique network that efficiently couples the source (transmitter) to the reactive load (antenna). The coupling network is applicable to any such circumstance that may require the efficient coupling of a source to a highly reactive load.

SUMMARY OF THE INVENTION

Briefly, according to one aspect of the invention, there is provided a coupling network for coupling a signal at a frequency from a voltage source to a load. The voltage source has a source resistance. The load has a load resistance and a load reactance. The ratio of the load reactance to the load resistance greater than 100. The coupling network includes a reactive element and a delay circuit. The reactive element is arranged in series with the load to resonate with the load reactance at the frequency. The delay circuit is between the reactive element and the source, has a delay equivalent to a quarter wave length transmission line at the frequency and has a characteristic impedance equal to the square root of the product of the values of the load resistance and the source required load resistance.

BRIEF DESCRIPTION OF THE DRAWINGS

The single

DETAILED DESCRIPTION OF THE INVENTION

Figure 1:
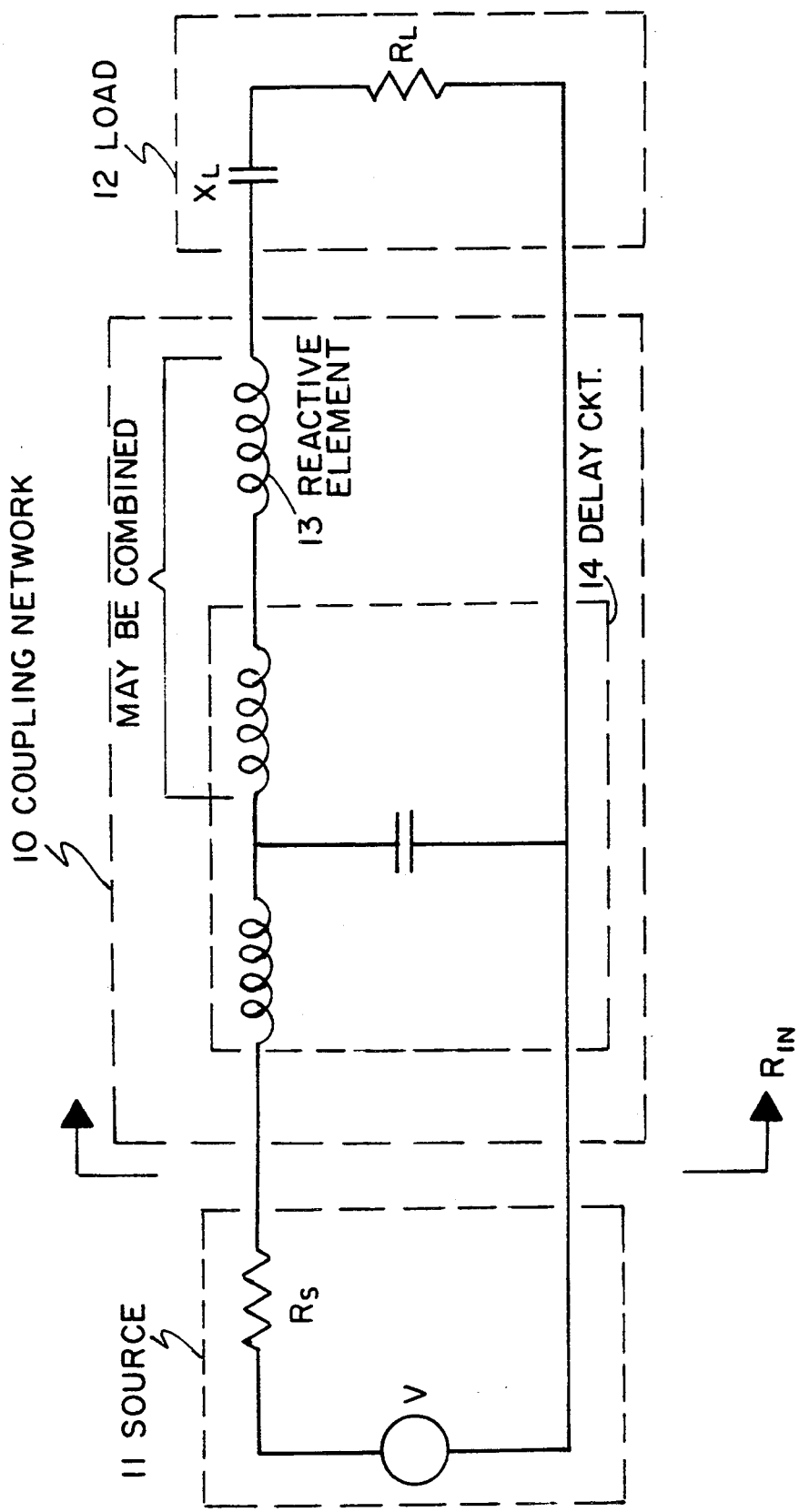
FIG. 1 is a schematic representation of a coupling circuit embodying the invention.

Referring to the figure, a coupling network 10 for coupling a signal at a frequency from a voltage source 11 to a load 12. Voltage source 11 has a source resistance $R_S$. Load 12 has a load resistance $R_L$ and a load reactance $X_L$. The voltage source 11 performs best when it feeds a load resistance $R_{IN}$. The ratio of the load reactance to the load resistance is greater than 100. Coupling network 10 includes a reactive element 13 and a delay circuit 14. Reactive element 13 is arranged in series with load 12 to resonate with load reactance $X_L$ at the frequency. Delay circuit 14 is between the reactive element 13 and source 11, has a delay equivalent to a quarter wave length transmission line at the frequency and has a characteristic impedance equal to the square root of the product of the values of the load resistance $R_L$ and the source required load resistance $R_{IN}$ which is the resistance seen looking into the input of the coupling network.

As an example, delay circuit 14 is shown as a LC tee. Preferably one or more of the components of delay circuit 14 is combined with reactive element 13.

When considering a coupling network, it is not only important to consider the properties of the load, but also the properties of the source. The two are of equal importance to the successful solution of the problem. The characteristics of the source can be used to advantage and can be augmented or changed to optimize the efficiency of the energy transfer. This coupling technique uses this to maximum advantage.

The classic approach has been to resonate the load reactance and then transform the resulting resistance to the desired value to properly load the source at the desired power levels. It is the resistive portion that represents the useful work performed by the load. In a highly reactive load the resistive part is usually very low but the ratio of reactance to resistance associated with the load resistance impacts the overall efficiency of the total system. For this discussion, efficiency will only deal with the power delivered to the load resistance. There is also a series resistance associated with the source. For high efficiency, this resistance must be much smaller than the transformed load resistance, as power is also lost in this source resistance. The simple efficiency is the load resistance divided by the sum of the load and source resistance. Because of the large reactances involved there will be large current excursions, however modern solid state transmitters can handle these excesses.

The source may be a Very Low Frequency transmitter and the load may be a high Q VLF antenna. A VLF transmitter may have a resistive output impedance of 24 ohms. A VLF antenna may typically have a load resistance of 0.1 ohms and a capacitive reactance of $-j50$ ohms at 15 KHz (Q=500). The operating frequencies include the range of 14 Khz. to 30 Khz.

The network couples the output of a solid state transmitter to a practical radio antenna that has a high ratio of reactance to resistance such that the natural bandwidth is much less than the required signal bandwidth. One object of the method is to provide an impedance transformation between the output terminals or a transmitter and the drive point of an antenna such that high electrical power efficiency will be achieved, simultaneous with minimized distortion of communications signal information content due to the high Q (ratio of load reactance to resistance) of the antenna. Furthermore, the design provides simplicity of implementation with components of practical, realizable electrical values and comparatively small physical size.

The stated attributes of high efficiency power transfer, low signal distortion and practical realizability mark the invented design as a significant advancement to the technology of radio transmitter systems, particularly in applications of high output power levels and VLF operating frequencies. The matching coupling network allows the efficient coupling of energy from a low internal source resistance generator, through an impedance transforming network that also provides a bandwidth extension many times the natural bandwidth of the load and a significant attenuation of harmonics and spurious signals.

In addition to providing for efficient energy transfer over many natural bandwidths, it may also be desirable to provide for exactly the opposite condition at frequency bands removed from the desired band. This might include but need not be restricted to the harmonics of the desired signal. This also is a long desired property of such an energy transferring network. The coupling network when implemented as a low-pass network, suppresses spurious signals.

The invention has been described in terms of the preferred embodiment, and the best mode of practicing the invention has been set forth. Modifications will be apparent to those skilled in the art. Accordingly, the scope of the invention is to be determined by the following claims.

What is claimed is:

1. A coupling network for coupling a signal at a frequency from a voltage source to a load, said voltage source having a source resistance, said load having a load resistance and a load reactance, the ratio of said load reactance to said load resistance greater than 100, said coupling network comprising:

a reactive element arranged in series with said load to resonate with said load reactance at said frequency; and a delay circuit between said reactive element and said source, having a delay equivalent to a quarter wave length transmission line at said frequency and having a characteristic impedance equal to the square root of the product of the values of said load resistance and the source required load resistance, said source required load resistance defined as the resistance seen looking into the input of the coupling network.

2. A coupling network for coupling a signal at a frequency from a transmitter to a antenna, said transmitter having a source resistance, said antenna having a load resistance and a load reactance, the ratio of said load reactance to said load resistance greater than 100, said coupling network comprising:

a reactive element arranged in series with said antenna to resonate with said load reactance at said frequency; and a delay circuit between said reactive element and transmitter, having a delay equivalent to a quarter wave length transmission line at said frequency and having a characteristic impedance equal to the square root of the product of the values of said load resistance and the source required load resistance, said source required load resistance defined as the resistance seen looking into the input of the coupling network.

3. In combination, a voltage source providing a signal at a frequency, a load, and a coupling circuit interposed between said voltage source and said load, said voltage source having a source resistance, said load having a load resistance and a load reactance, the ratio of said load reactance to said load resistance greater than 100, said coupling circuit comprising:

a reactive element arranged in series with said load to resonate with said load reactance at said frequency; and a delay circuit between said reactive element and said source, having a delay equivalent to a quarter wave length transmission line at said frequency, and having a characteristic impedance equal to the square root of the product of the values of said load resistance and the source required load resistance, said source required load resistance defined as the resistance seen looking into the input of the coupling network.

4. The combination of claim 3 wherein said source is a Very Low Frequency transmitter and said load is an antenna.

* * * * *